(12) United States Patent
Cho et al.

(10) Patent No.: US 10,885,835 B2
(45) Date of Patent: Jan. 5, 2021

(54) DISPLAY DEVICE

(71) Applicant: LG ELECTRONICS INC., Seoul (KR)

(72) Inventors: Jinhum Cho, Seoul (KR); Hyunsik Kim, Seoul (KR); Honghae Do, Seoul (KR); Jaeuk Ryu, Seoul (KR); Hyunchul Moon, Seoul (KR); Chunsoo Chang, Seoul (KR); Sangmoon Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 124 days.

(21) Appl. No.: 16/139,863

(22) Filed: Sep. 24, 2018

(65) Prior Publication Data

US 2020/0027391 A1    Jan. 23, 2020

(30) Foreign Application Priority Data

Jul. 23, 2018 (KR) .......................... 10-2018-0085366

(51) Int. Cl.
*G09G 3/3208* (2016.01)
*H01L 27/32* (2006.01)
(Continued)

(52) U.S. Cl.
CPC ....... *G09G 3/3208* (2013.01); *H01L 27/3244* (2013.01); *H01L 51/0097* (2013.01);
(Continued)

(58) Field of Classification Search
CPC ............ G09G 3/3208; G09G 2360/02; G09G 2370/16; G09G /; H01L 27/3244; H01L 51/0097; H01L 51/5237; H04N 5/64
(Continued)

(56) References Cited

U.S. PATENT DOCUMENTS 6,256,075 B1 * 7/2001 Yang ..................... G06F 1/1601
                                                           312/7.2
2007/0103865 A1 * 5/2007 Kim ................... H05K 7/20972
                                                           361/694

(Continued)

FOREIGN PATENT DOCUMENTS

KR    10-2003-0096901 A    12/2003

*Primary Examiner* — Kent W Chang
*Assistant Examiner* — Sujit Shah
(74) *Attorney, Agent, or Firm* — Birch, Stewart, Kolasch & Birch, LLP

(57) ABSTRACT

There is disclosed a display device comprising a display panel; an inner plate disposed on a rear surface of the display panel; a module cover disposed on a rear surface of the inner plate; a space formed between the inner plate and the module cover; and a back cover configured to form a loading portion by covering a first area provided in a rear surface of the module cover and being coupled to the first area, wherein the module cover comprises a lateral wall portion projected from a circumference of the first area toward the rear surface and configured to define a lateral surface of the loading portion; an inclined portion inclined from the lateral wall portion and extended toward the front surface; a first vent hole formed in a first lateral wall portion provided in an upper area of the lateral wall portion and configured to communicate the loading portion and the space; a second vent hole formed in a first inclined portion provided in an upper area of the first area and configured to communicate the space with the outside; and a third vent hole formed in an upper area of the module cover.

10 Claims, 18 Drawing Sheets

(51) Int. Cl.
   *H01L 51/00*   (2006.01)
   *H01L 51/52*   (2006.01)
   *H04N 5/64*    (2006.01)

(52) U.S. Cl.
   CPC ..... *H01L 51/5237* (2013.01); *G09G 2360/02* (2013.01); *G09G 2370/16* (2013.01); *H04N 5/64* (2013.01)

(58) Field of Classification Search
   USPC .......................................................... 345/836
   See application file for complete search history.

(56) References Cited

U.S. PATENT DOCUMENTS

| | | | | |
|---|---|---|---|---|
| 2007/0103909 A1* | 5/2007 | Park | .................. | H05K 7/20972 |
| | | | | 362/294 |
| 2013/0070160 A1* | 3/2013 | Sumitomo | ............ | H04N 5/655 |
| | | | | 348/725 |
| 2014/0152907 A1* | 6/2014 | Yokawa | .................... | H04N 5/64 |
| | | | | 348/836 |
| 2014/0320752 A1* | 10/2014 | Kawasaki | .............. | H04N 5/655 |
| | | | | 348/836 |
| 2015/0289397 A1 | 10/2015 | Kim et al. | | |
| 2016/0259207 A1* | 9/2016 | Matsuo | .................. | F21V 29/70 |
| 2016/0357058 A1 | 12/2016 | Sekiguchi | | |
| 2017/0192293 A1 | 7/2017 | Lee et al. | | |

\* cited by examiner (a)

(b)

(c)

(d)

(a)

(b)

(c)

(a)  (b)

| Bead | Reference | 1 mm Type A | 2 mm Type A | 3 mm Type A | 2 mm Type B |
|---|---|---|---|---|---|
| Gravity | 15.1 mm | 15.6 mm 33.8 % ▲ | 12.5 mm 17.2 % ▲ | 10.0 mm 33.8 % ▲ | 12.0 mm 20.5 % ▲ |
| Twist | 134.1 mm | 146.3 mm 9.1 % ▼ | 130.0 mm 3.1 % ▲ | 117.4 mm 12.5 % ▲ | 126.4 mm 5.7 % ▲ |
| 3 PB | 2.89 mm | 5.78 mm 100.0 % ▼ | 4.08 mm 41.2 % ▼ | 2.82 mm 2.4 % ▲ | 3.72 mm 28.7 % ▼ |

(c)

| Module Cover | Reference (w/o bead w' bar) | 1.2T | 1.0T | 1.0T |
|---|---|---|---|---|
| Bead | | 3 mm (A type) | 5 mm (A type) | 5 mm (B type) |
| Gravity | 15.1 mm | 10 mm 33.8 % ▲ | 8.99 mm 40.4 % ▲ | 6.4 mm 57.4 % ▲ |
| Twist | 134.1 mm | 117.4 mm 12.5 % ▲ | 145.8 mm 8.72 % ▼ | 133.6 mm 0.4 % ▲ |
| 3 Point Bending | 2.89 mm | 2.82 mm 2.4% ▲ | 2.71 mm 6.3% ▲ | 2.55 mm 11.8% ▲ |

(c)

(a)

(b)

Max 43.7 / ΔT : 7.9

(a)

Max 43.9 / ΔT : 5.9

(b)

Max. 82.9 / AVG. 58.3

(c)

Max. 69.7 / AVG. 54.6

(d)

(a)

(b)

(a)

(b)

(c)

DISPLAY DEVICE

CROSS-REFERENCE TO RELATED APPLICATIONS

This application claims priority to Korean Patent Application No. 10-2018-0085366 filed on Jul. 23, 2018 in Korea, the entire contents of which is hereby incorporated by reference in its entirety.

BACKGROUND OF THE DISCLOSURE

Field of the Disclosure

Embodiments of the present disclosure relate to a display device which is able to save the manufacture cost by improving a structure of a module cover configured to be attached to a back side of a display panel.

Background of the Disclosure

A display device includes Liquid Crystal Display (LCD), Field Emission Display (FED), Plasma Display Panel (PDP) and Electroluminescence Device. An Active Matrix Organic Light Emitting Diode (OLED) display device came onto the market as one example of the Electroluminescence Device. The OLED display device is a spontaneous emission device and includes no backlight with advantages of a good response speed and a good view angle such that it is under the spotlight as the next generation display.

In case of using the OLED display as the display panel, the OLED display is made of a flexible material and the stiffness of a module cover configured to support the OLED display is then very important. A module cover provided in a conventional display device has a predetermined thickness. However, with a recent trend of a slim display device, the module cover is usually formed of only a metal plate and it becomes then difficult to secure the sufficient stiffness.

The conventional display device includes a first module cover arranged in a rear surface of the display panel; and a second module cover arranged in a rear surface of the first module cover and configured to define the exterior of the display device, so as to secure the stiffness. The first module cover located in an inner area may be made of a material having high heat conductivity to shut off the heat generated in a controller arranged in the rear surface of the module cover from being transmitted to the display panel.

However, when the display panel is configured of the two metal plates, the manufacture cost is likely to rise and the overall weight of the product is likely to rise disadvantageously. Especially, as the display device tends to become larger recently, it is important to reduce the overall weight.

SUMMARY OF THE DISCLOSURE

Accordingly, an object of the present invention is to address the above-noted and other problems.

An object of the present disclosure is to provide a display device which is able to reduce the weight of the product and save the manufacture cost by using a module cover injection-molded of plastic and attached to a rear surface of a display panel.

Embodiments of the present disclosure provide a display device comprising: a display panel; an inner plate disposed on a rear surface of the display panel; a module cover disposed on a rear surface of the inner plate; a space formed between the inner plate and the module cover; and a back cover configured to form a loading portion by covering a first area provided in a rear surface of the module cover and being coupled to the first area, wherein the module cover comprises a lateral wall portion projected from a circumference of the first area toward the rear surface and configured to define a lateral surface of the loading portion; an inclined portion inclined from the lateral wall portion and extended toward the front surface; a first vent hole formed in a first lateral wall portion provided in an upper area of the lateral wall portion and configured to communicate the loading portion and the space; a second vent hole formed in a first inclined portion provided in an upper area of the first area and configured to communicate the space with the outside; and a third vent hole formed in an upper area of the module cover.

The display device may further comprise a reinforcing rib projected from the front surface of the module cover.

The reinforcing rib may comprise a support area configured to contact with the inner plate; and a communication area spaced apart from the inner plate, and the air drawn into an electric control unit via the first vent hole may pass the communication area and be exhausted via the third vent hole.

The reinforcing rib may comprise a first rib extended horizontally; and a second rib extended vertically, and the communication area is formed in the first rib.

The first rib and the second rib may be arranged in a lattice shape, and the communication area may be located at an intersection of the first and second ribs.

The display device may further comprise a fourth vent hole formed in the back cover.

The display device may further comprise a plurality of coupling holes formed in the inner plate; and a coupling projection projected from a front surface of the module cover toward the inner plate and exposed via the coupling holes, wherein the coupling projection is formed in the coupling hole by thermosetting.

The display device may further comprise a thermosetting groove recessed from an outer edge area of the coupling hole toward the rear surface, wherein an end of the thermoset coupling projection is larger than a diameter of the coupling hole and smaller than a diameter of the thermosetting groove.

The display device may further comprise a reinforcing rib projected from a front surface of the module cover, wherein the coupling projection is formed on the reinforcing rib, and the reinforcing rib comprises a groove formed around the coupling projection, corresponding to the thermosetting groove.

The display device may further comprise a first boss projected from a front surface of the module cover; a first boss hole formed in the inner plate, corresponding to the first boss; and a first screw configured to be fastened to the first boss hole.

The display device may further comprise a second boss projected from the first area of the module cover toward the rear surface; a third boss projected from the inner plate toward the rear surface; a second boss hole formed in the module cover and configured to pass the third boss there through; a printed circuit board comprising a third boss hole corresponding to the second boss and the third boss; and a second screw configured to penetrate the third boss hole of the printed circuit board and be fastened to the second boss and the third boss.

According to the embodiments, the display device includes the module cover attached to the rear surface of the display panel and injection-molded of plastic. Accordingly, the overall weight of the product may be reduced and the manufacture cost may be also saved.

Furthermore, the display device is capable of efficiently radiating heat, even when using the module cover made of the non-metal material. Accordingly, the temperature of the display device may be prevented from rising.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by illustration only, and thus are not limitative of the present invention, and wherein.

DESCRIPTION OF SPECIFIC EMBODIMENTS

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
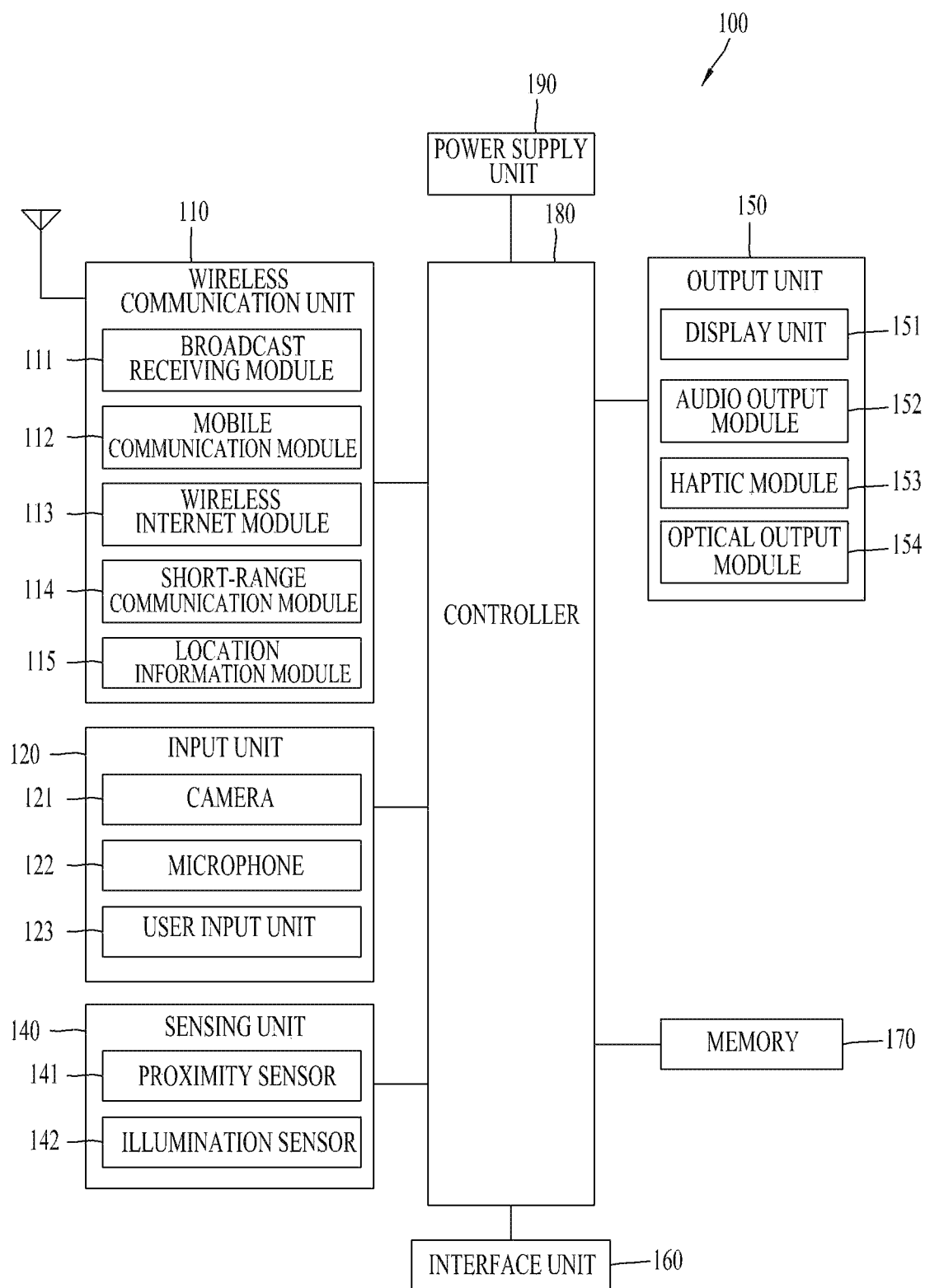
FIG. 1 is a block diagram of a display device in accordance with the present disclosure.

FIG. 1 is a block diagram of a display device in accordance with the present disclosure.

The display device 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components in The FIG. 1 is not a requirement, and that greater or fewer components may alternatively be implemented.

More specifically, the wireless communication unit 110 typically includes one or more modules which permit communications such as wireless communications between the display device 100 and a wireless communication system, communications between the display device 100 and another display device, communications between the display device 100 and an external server. Further, the wireless communication unit 110 typically includes one or more modules which connect the display device 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the display device, the surrounding environment of the display device, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The display device 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the display device 100 and a user, as well as function as the user input unit 123 which provides an input interface between the display device 100 and the user.

The interface unit 160 serves as an interface with various types of external devices that can be coupled to the display device 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the display device 100 may perform assorted control functions associated with a connected external device, in response to the external device being connected to the interface unit 160.

The memory 170 is typically implemented to store data to support various functions or features of the display device 100. For instance, the memory 170 may be configured to store application programs executed in the display device 100, data or instructions for operations of the display device 100, and the like. Some of these application programs may be downloaded from an external server via wireless communication. Other application programs may be installed within the display device 100 at time of manufacturing or shipping, which is typically the case for basic functions of the display device 100 (for example, receiving a call, placing a call, receiving a message, sending a message, and the like). It is common for application programs to be stored in the memory 170, installed in the display device 100, and executed by the controller 180 to perform an operation (or function) for the display device 100.

The controller 180 typically functions to control overall operation of the display device 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1. Moreover, the controller 180 may be implemented to combinedly operate two or more of the components provided in the display device 100 to drive the application programs.

The power supply unit 190 can be configured to receive external power or provide internal power in order to supply appropriate power required for operating elements and components included in the display device 100. The power supply unit 190 may include a battery, and the battery may be configured to be embedded in the terminal body, or configured to be detachable from the terminal body.

Some or more of the components may be operated cooperatively to embody an operation, control or a control method of the display device in accordance with embodiments of the present disclosure. Also, the operation, control or control method of the display device may be realized on the display device by driving of one or more application problems stored in the memory 170.

Figure 2:
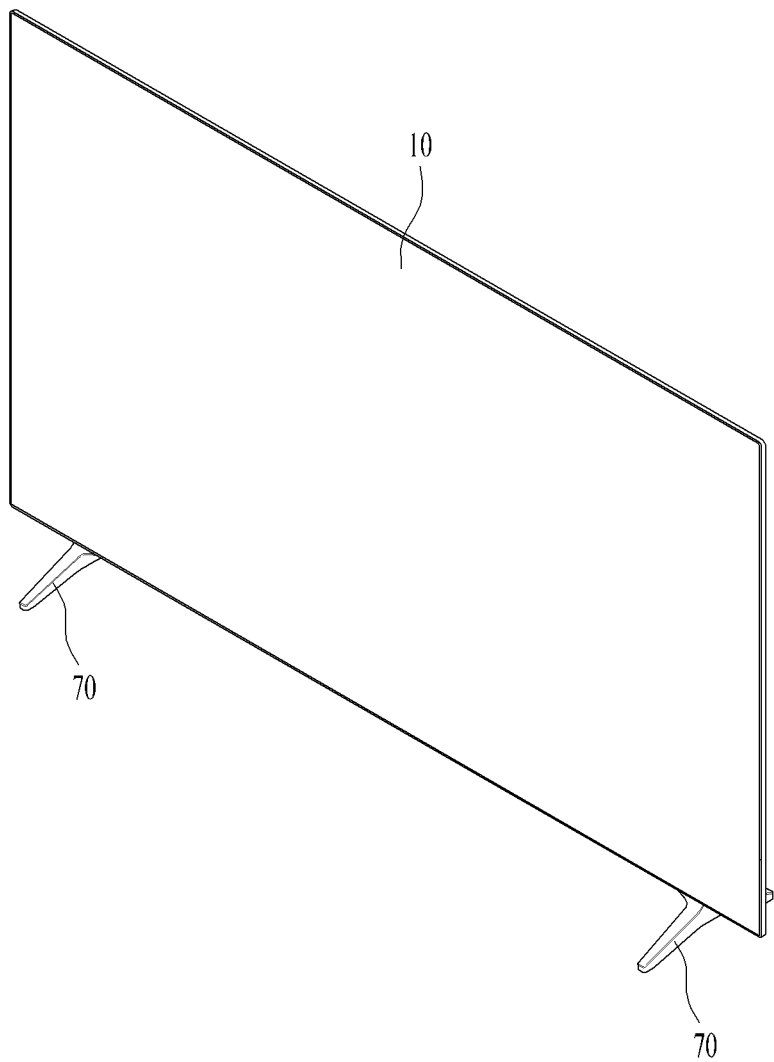
FIG. 2 is a front perspective diagram illustrating one embodiment of the display device.

FIG. 2 is a front perspective diagram illustrating one embodiment of the display device 100. The display device 100 is characterized in a rectangular shape with a long traverse side. In other words, a long side is arranged in a traverse direction and a short side is arranged in a vertical direction. The display device 100 may include a stand for standing the display device 100. A wall mount type display panel may include not stand.

A display panel 10 may include a transparent substrate; an upper electrode; an organic light emitting layer; and a lower electrode. The transparent substrate, the upper electrode, the organic light emitting layer and the lower electrode may be arranged sequentially.

Each of the transparent substrate and upper electrode may include a transparent material (e.g., ITO). The lower electrode may not include such a transparent material. Not limited thereto, the lower electrode may also include a transparent material (e.g., ITO). In this instance, light may be emitted from one surface of the lower electrode.

For example, the display device 100 may be an (Organic Light Emitting Diode (OLED) display 100. An Active Matrix OLED display panel includes Organic Light Emitting Diode (OLED), with advantages of a fast response speed and high light-emitting efficiency, brightness and view angle.

The OLED which is a spontaneous light emitting element may include an anode electrode; a cathode electrode; and an organic compound layer (HIL, HTL, EML, ETL and EIL) formed between the two electrodes. The organic compound layer is configured of a Hole Injection Layer (HIL), a Hole Transport Layer (HTL), an Emission Layer (EML), an Electron Transport Layer (ETL) and an Electron Injection Layer (EIL). When a drive voltage is applied to the anode and cathode electrodes, an electron passes HTL and ETL and then moves to EML to form an exciton, such that EML emits a visible light.

Accordingly, OLED needs no auxiliary light source and reduces the volume and weight of the display device 100. OLED has a fast response speed which is over 100 times faster than a response speed of the display device 100. When displaying an image, OLED leaves no afterimage.

The conventional display device usually uses LCD as the display panel. The LCD includes a backlight unit; and an auxiliary member for supplying light such as a polarizing film, such that the display device may become thick. Also, with several layers which are aligned, the conventional display device uses a case configured to press front and rear surface to fix the layers. The case may cover a bezel area in which a signal line is loaded, except an image-display area of the display panel, and also cover an outer area and front and lateral surfaces of the display device to prevent the light emitted from the backlight unit from coming through the lateral surface, not the front surface.

However, the OLED display panel is used recently so as to have no light escaping caused by the backlight unit and require no support structure for supporting the multi-layer structure configured of the backlight unit and the polarizing film. Accordingly, the structure of the display panel can be simplified. As the bezel around the OLED display panel is smaller than the bezel around the LCD panel, the OLED display panel may have the case structure configured of only the module cover 20 coupled to a rear surface, omitting a front case for covering the bezel.

Figure 3:
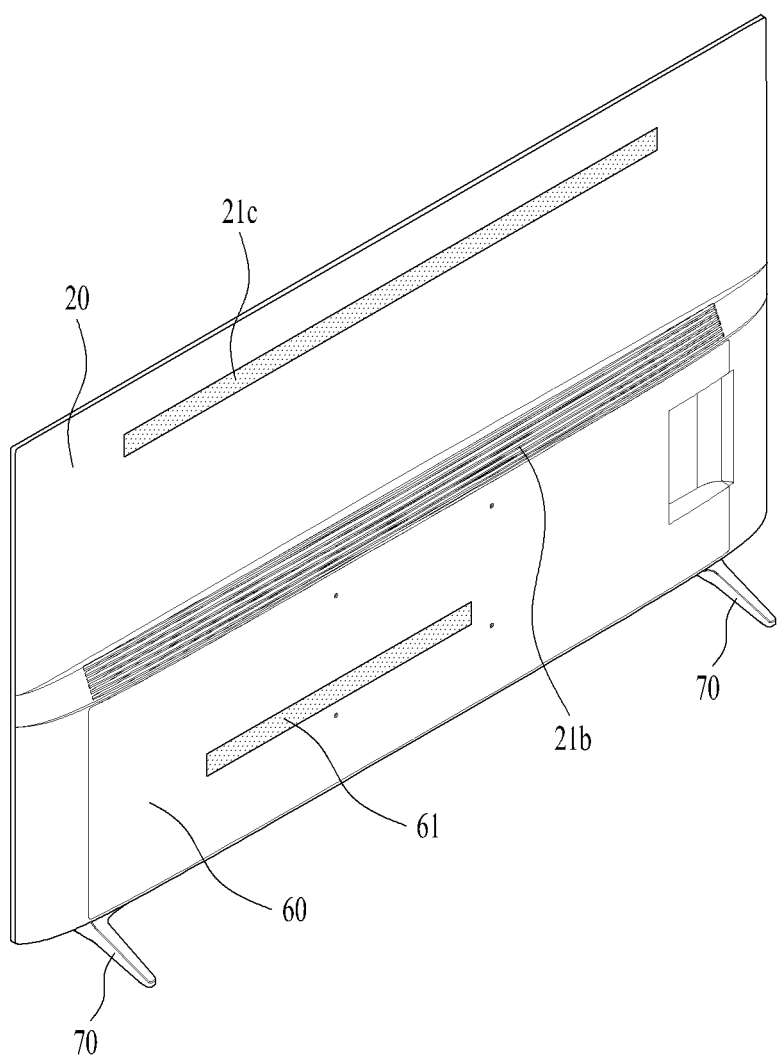
FIG. 3 is a rear view illustrating the embodiment of the display device.
Figure 4:
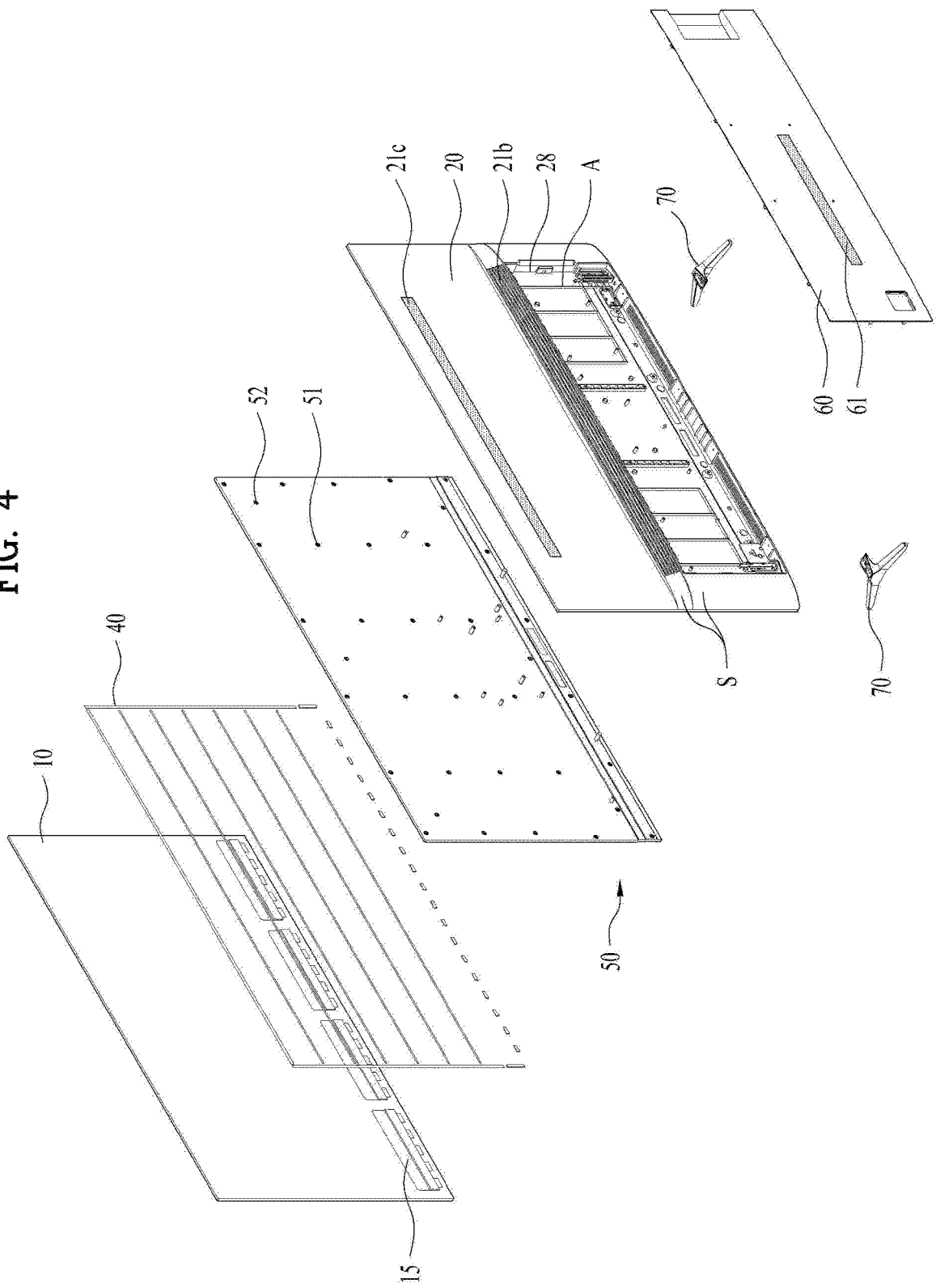
FIG. 4 is an exploded perspective diagram illustrating the embodiment of the display device.

FIG. 3 is a rear view illustrating the embodiment of the display device 100. FIG. 4 is an exploded perspective diagram illustrating the embodiment of the display device 100. The display device includes a display panel 10; an inner plate 50 disposed on a rear surface of the display panel 10; a module cover 20 arranged on a rear surface of the inner plate 50; and a back cover 60 configured to cover a first area (A) of a rear surface of the module cover 20 and define a loading portion.

A panel drive unit 15 configured to control each pixel of the display panel 10 may be connected to an end of the display panel 10 via a flexible substrate. When coupled to the module cover 20, the flexible substrate is bent to contact with a rear surface of the display panel 10.

The module cover 20 may be coupled to the rear surface of the display panel 10 by using an adhesive material 40. A double-sided tape may be used as the adhesive material 40.

In the conventional display device, the module cover is made of metal and a hard bar is provided to reinforce the stiffness of the display device. If even module cover is made of metal, the overall weight of the display device will increase and the manufacture cost will rise. To manufacture the module cover of the display device a low cost, the display device in accordance with the present disclosure may include the module cover molded by injection.

The inner plate 50 provided in the thin display device 100 such as OLED display is disposed between the display panel 10 and the module cover 20 so as to reinforce the stiffness of the display device 100. As the display device becomes thicker, the stiffness becomes stronger but the manufacture cost and the weight of the product will rise more. It is preferred to use the inner plate 50 having a thickness of 1 mm or less.

The inner plate 50 is configured not only to reinforce the stiffness of the display device but also to disperse the heat generated in the controller 180 implemented to drive the display device 100 so as to solve the problem of the heat concentration. Accordingly, the inner plate 50 may be formed of a predetermined material with a great stiffness and a high heat transmission rate.

The back cover 60 is configured to cover the electronic components including the printed circuit board 181 loaded in an electric control unit from being exposed outside. The back cover 60 may be formed of the same material with the module cover 20. The electric control unit may be formed between the module cover 20 and the first area (A) of the back cover 60. A lateral wall portion 28 may be projected from a circumference of the first area (A) toward the rear surface to define the space in which the electronic components are loaded. The circumference of the electric control unit is surrounded by the lateral wall portion 28 and the first area (A) of the module cover 20 is located in the front surface and the back cover 60 is located in the rear surface. An inclined portion (S) may be further provided at an end of the lateral wall portion 28, corresponding to the height of the lateral wall portion 28. In other words, the first area (A) may be a projection projected toward the rear surface of the display device 100.

Figure 5:
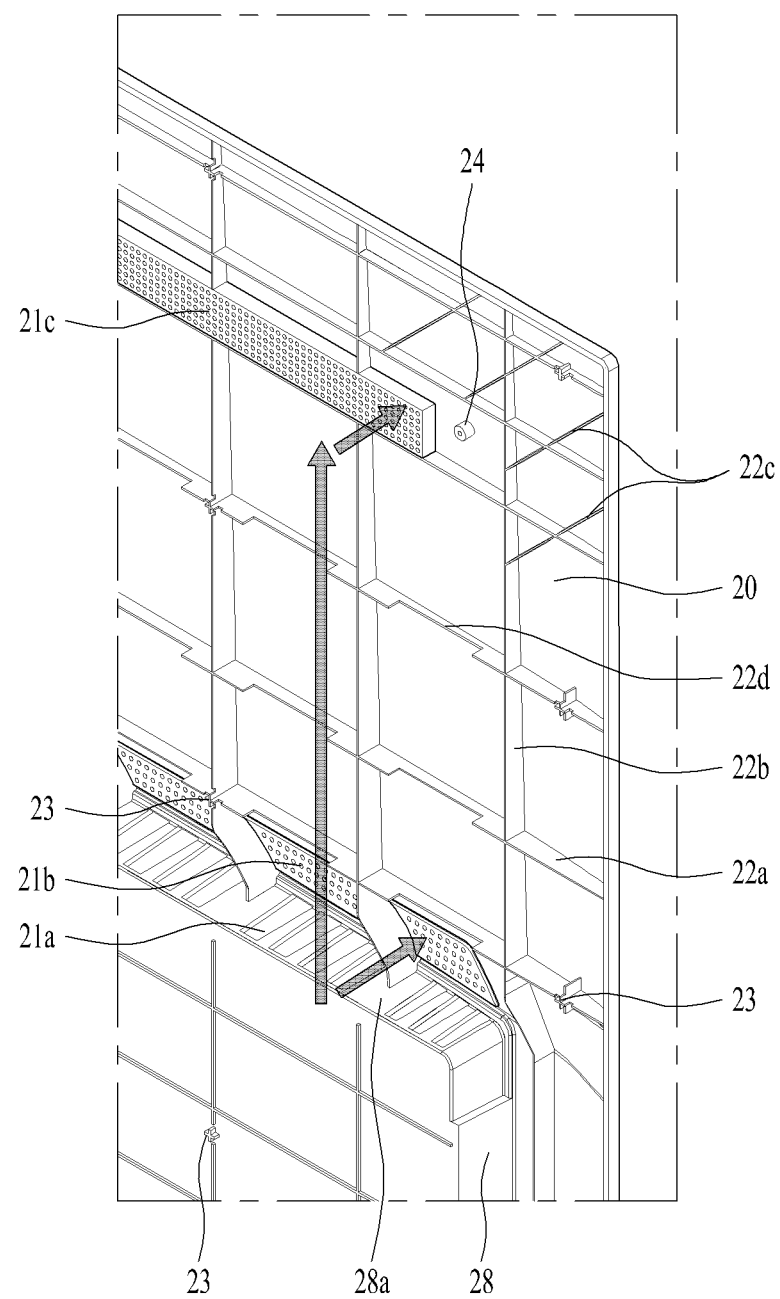
FIG. 5 is a diagram illustrating an inner surface of a module cover provided in the display device.

FIG. 5 is a diagram illustrating an inner surface of the module cover 20 provided in the display device 100. When the module cover 20 is formed of the injection mold instead of the metal, the strength of the display device is likely to become weak disadvantageously and a reinforcing rib 22 may be formed in the opposite surface to the inner plate. The reinforcing rib 22 is projected from the front surface of the module cover 20 toward the inner plate 50 and longitudinally extended from the module cover 20 in one direction to prevent the bending toward the extended direction of the reinforcing rib 22.

As shown in FIG. 5, a first horizontal rib 22a and a second vertical rib 22b may be arranged in a lattice type. As corners of the inner plate could be applied an external force in a diagonal direction, a third diagonal rib 23 may be further arranged to compensate the applied force.

A predetermined space may be formed between the inner plate 50 and the module cover 20, corresponding to the height or distance of the reinforcing rib 22. In other words, an end of the reinforcing rib 22 contacts with the rear surface of the inner plate 50 such that the reinforcing rib 22 can support the inner plate 50. The inclined portion (S) is spaced a long distance apart from the inner plate 50 such that the reinforcing rib 22 cannot contact with the inner plate 50.

The electronic components loaded in the electric control unit usually generate heat. To radiate the heat generated in the electric control unit, the module cover 20 may include a plurality of vent holes. As shown in FIG. 5, a plurality of first vent holes 21a may be formed in a first lateral wall portion 28a located in an upper area of the lateral wall portion 28 provided in the electric control unit, in communication with the space between the module cover 20 and the inner plate 50. Each of the vent hole 21a may be enlarged to radiate the heat generated in the electric control unit easily.

When the first vent holes 21a directly connected with the electric control unit are enlarged, the exposed first vent holes might deteriorate the exterior beauty and the electronic components loaded in the electric control unit are likely to be exposed outside. Accordingly, the largest one of the first vent holes 21a directly formed in the electric control unit is allowed to communicate with the space and a second vent hole 21b and a third vent hole 21c may be further provided.

The second vent hole 21b may be directly formed adjacent to the first vent hole 21a and substantially formed in the inclined surface (S) located in the upper area of the electric control unit. The second vent hole 21b is directly exposed outside and formed smaller than the first vent hole 21a. There is a difference between the sizes of the vent holes such that it may be difficult to radiate all of the heat from the first vent hole 21 to the second vent hole 21b. Also, the second vent hole 21b is formed in the inclined surface of the module cover 20 such that air can stay in the space defined by the lateral wall portion 28 and the inclined surface (S) not to be exhausted fast.

To solve such disadvantages, a third vent hole 21c may be further formed in the upper area of the module cover 20. The space defined between the module cover 20 and the inner plate 50 is narrow enough to radiate the hot air from the first vent hole 21a to the third vent hole 21c upwardly.

In case the reinforcing rib 22 is formed toward the front surface of the module cover 20 as mentioned above, the reinforcing rib 22 has the corresponding height to the space formed with the inner plate 50 such that it may be difficult to radiate the heat from the first vent hole 21a to the second vent hole 21b. Especially, the flow from the first vent hole 21a to the third vent hole 21c may be performed in a vertical direction and it is shut off by the first rib 22a extended in a horizontal direction.

To solve that, the reinforcing rib 22 may be partially omitted to form a communication area 22d. The communication area 22d may be formed in a hole shape or by varying the height of the reinforcing rib 22 as shown in FIG. 5. The communication area 22d may be formed in the second reinforcing rib 22 extended horizontally. However, heat tends to move vertically and it is preferred that the communication area is formed in the first rib 22a.

A fourth vent hole 61 may be further formed in a lower area of the electric control unit to radiate the heat generated in the electric control unit. The fourth vent hole 61 is formed only to allow air drawn therein such that it may not be formed too large. The second vent hole 21b, the third vent hole 21c and the fourth vent hole 61 are exposed outside such that they may have an inclined cross section area to make the internal components not visible outside directly.

Figure 6:
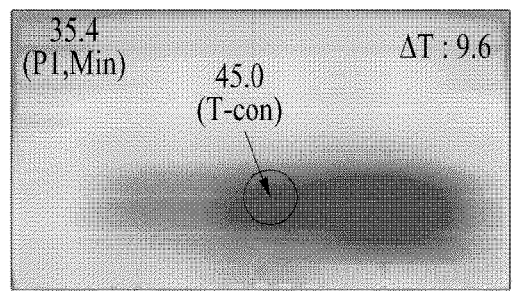
FIG. 6 is a diagram illustrating the measured heat generated in the display device in accordance with the present disclosure and the measured heat generated in the conventional display device.
Figure 6:
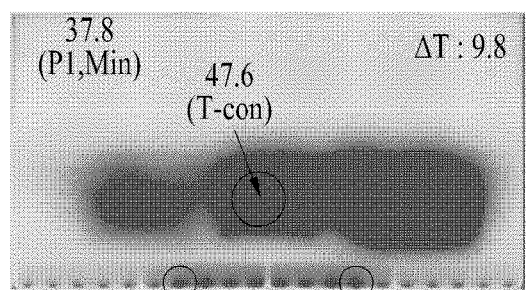
Figure 6:
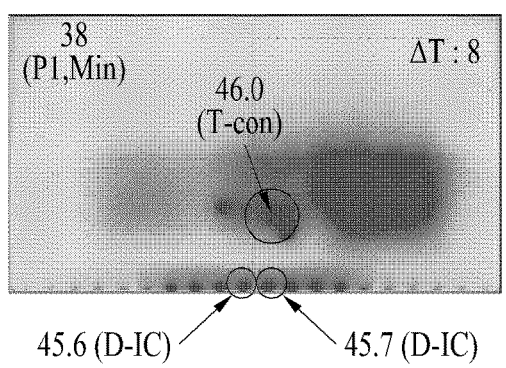
Figure 6:
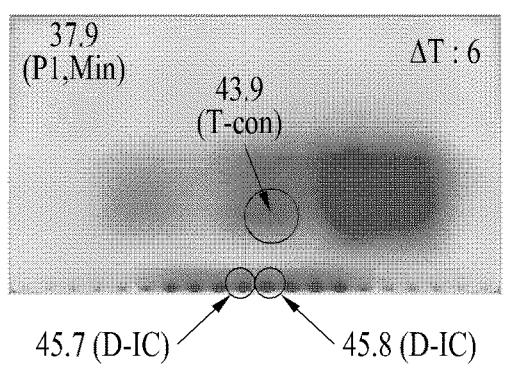

FIG. 6 is a diagram illustrating the measured heat generated in the display device in accordance with the present disclosure and the measured heat generated in the conventional display device. It is shown that the temperature of the display device is measured when the temperature rises to a preset value or more enough to be saturated. The area in which the printed circuit board 181 provided as the controller 180 is located is the hottest and the corners are the coldest. The smaller a difference between the temperatures of the two areas, the better.

The conventional display device (see FIG. 6 (a)) has a great radiation performance, because it uses the metal module cover 20 (the maximum temperature of 45° C. and the minimum temperature of 35.4° C. and the temperature difference of 9.5° C.). In the display device using the plastic injection-molded module cover 20, the heat radiation performance falls and shows the maximum temperature of 47.6° C. and the temperature difference of 9.8° C. and the temperature of 47.5° C. at the panel drive unit 15 configured to control the display panel 10.

According to the embodiment mentioned above, the first through fourth vent holes may be further formed to improve the heat radiation performance which is deteriorated by the use of the module cover 20. FIGS. 6 (c) and 6 (d) illustrate the heat distribution of the display device having the vent holes in accordance with the present disclosure. When the vent holes are additionally formed, the heat generated in the drive chip loaded in the electric control unit may be dispersed and the maximum temperature and the temperature difference may be lowered. FIG. 6 (c) illustrates the heat distribution of the display device having the inner plate 50 of 0.6 T (0.6 mm). FIG. 6 (d) illustrates the heat distribution of the display device having the inner plate 50 of 0.8 T (0.8 mm). When the inner plate 50 becomes thicker, the heat radiation performance becomes greater. When using the inner plate 50 of 0.8 T, the heat distribution of the display device is improved more such that the maximum temperature and the temperature difference may become lower (43.9° C. and 6° C.) than those shown in the heat distribution (FIG. 6 (a)) of the conventional display device enough to improve the performance.

Figure 7:
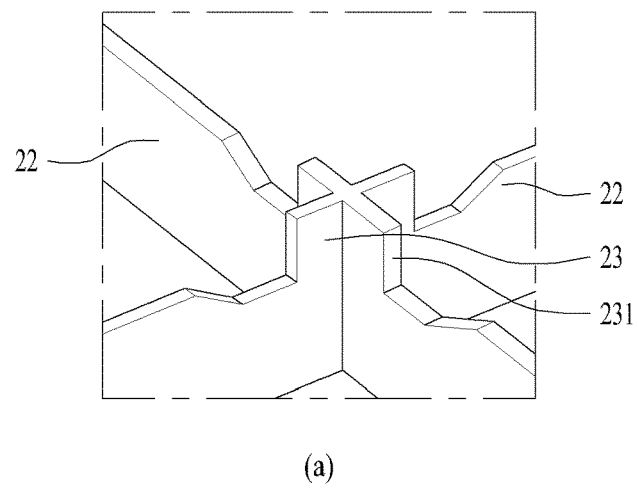
FIG. 7 is a diagram illustrating a coupling hole and a coupling projection which are provided in the display device.
Figure 7:
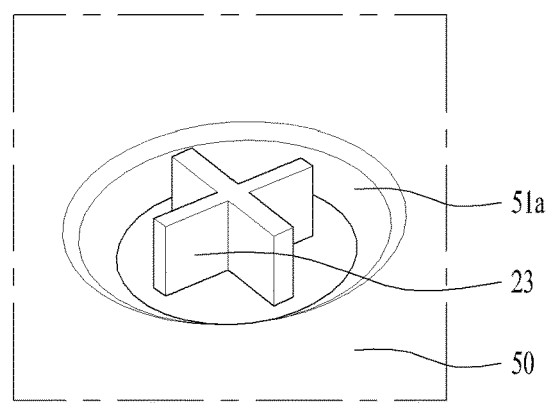
Figure 7:
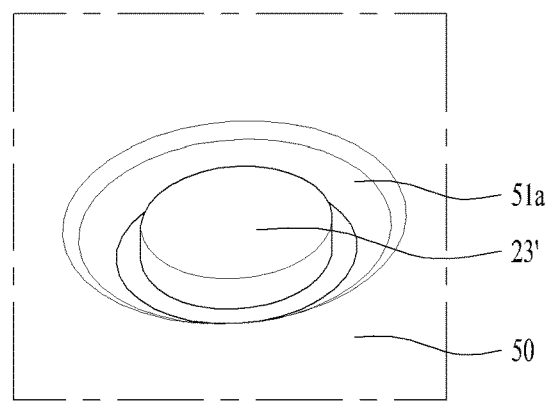
Figure 8:
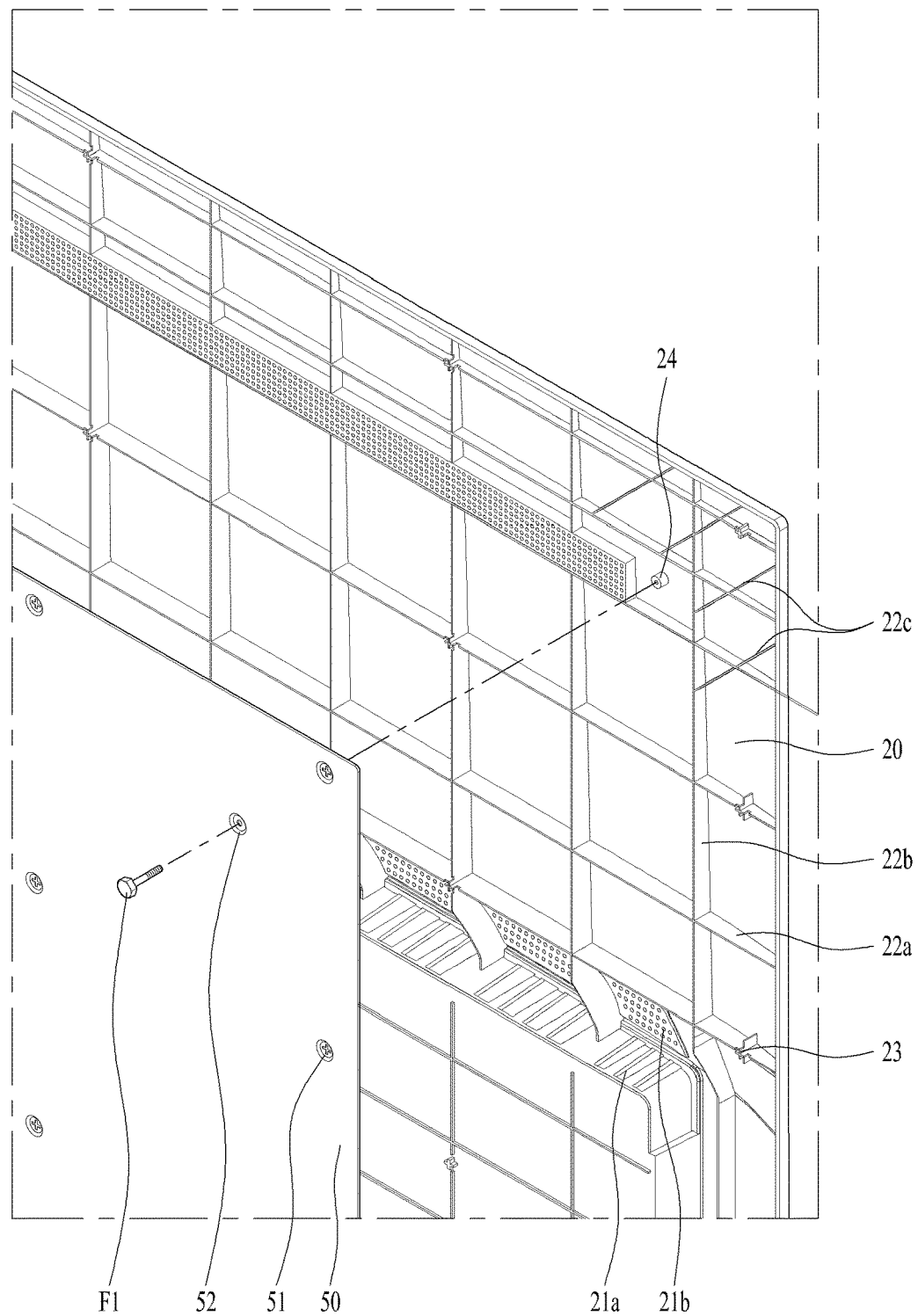
FIG. 8 is a diagram to describe a method of coupling an inner plate to the module cover by using a first screw.

Next, FIG. 7 is a diagram illustrating a coupling hole 51 and a coupling projection 24 which are provided in the display device. FIG. 8 is a diagram illustrating a first boss 24 and a second boss in accordance with the present disclosure. The coupling between the inner plate 50 and the module cover 20 may uses two methods including one heat staking method using the coupling hole 51 and the coupling projection 24 and the other coupling method of fastening a screw (F) to the boss projected from the inner plate 50 toward the rear surface.

The former method may couple several areas simultaneously and simplify the structure to reduce the manufacture cost and provide a stronger coupling force than the latter method. The manufacture cost may be saved and the coupling force may be secured by using the two methods simultaneously.

As shown in FIG. 7 (a), the coupling projection 24 is projected from the front surface of the module cover 20 and the coupling hole 510 is formed in the inner plate 50, corresponding to the coupling projection 24. When melting an end of the coupling projection 24 having penetrated the coupling hole 51 (see FIG. 7 (b)) by using the heat applied thereto, the end of the coupling projection 24 becomes wider than a diameter of the coupling hole 51 and the coupling projection 24 is fixedly coupled to the coupling hole 51 as shown in FIG. 7 (c).

The coupling projection 24 may be formed by using the reinforcing rib 22 mentioned above. As it is projected from the module cover 20 forwardly, the reinforcing rib 22 may be useable. Especially, when using the intersection of the first and second ribs 22a and 22b, the rigidity is strong enough to fixedly couple the inner plate 50 to the module cover 20.

The coupling hole 51 shown in FIG. 7 may be recessed from the front surface of the inner plate toward the rear surface, so as to prevent the end of the coupling projection 24 from being projected outside of the inner plate 50 after penetrating the coupling hole 51. Considering the height and width of the end 23' of the thermoset coupling projection 24 not to be projected outside from the surface to which the display panel 10 is attached, a larger thermosetting groove 51a may be formed. When the coupling projection 24 is formed in the reinforcing rib 22, a groove (231, see FIG. 7) may be formed in the reinforcing rib 22, corresponding to the projected area of the thermosetting groove 51a toward the rear surface.

FIG. 8 is a diagram to describe a method of coupling the inner plate 50 to the module cover 20 by using a first screw (F). The first boss 24 formed in the module cover 20 is projected toward the front surface, in other words, the inner plate 50 and the inner plate 50 includes a first boss hole 52 corresponding to the first boss 24. The first screw (F) is fastened to the first boss 24 through the first boss hole 52 to fixedly couple the inner plate 50 to the module cover 20.

Figure 9:
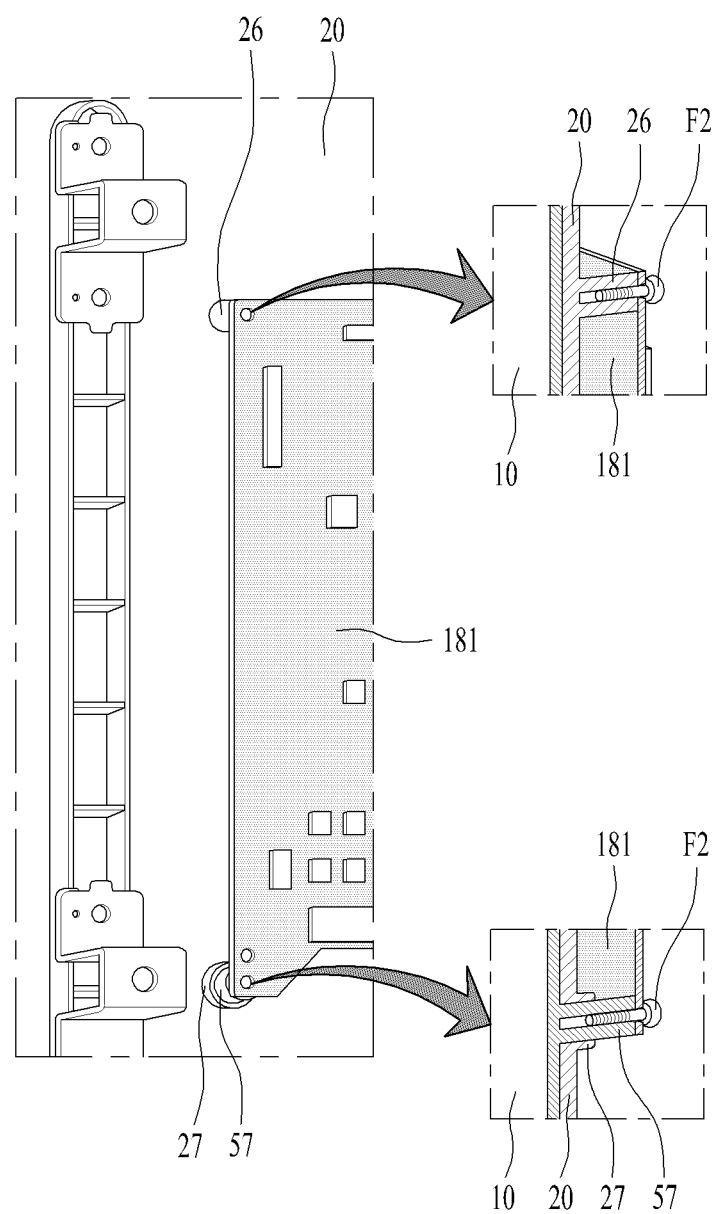
FIG. 9 is a diagram to describe a method of fixing a printed circuit board 181 of the display device.

FIG. 9 is a diagram to describe a method of fixing the printed circuit board 181 of the display device 100. The inner plate may include a second boss 57 projected from a first area (A) of the module cover 20 toward the rear surface; and a third boss 26 projected to the rear surface such that a second boss hole 27 may be formed in the module cover 20 to pass the third boss 26 there through. To fix the printed circuit board 181 loaded in the electric control unit, the third boss hole 26 formed in the printed circuit board 181 may be fastened to the second boss 57 and the third boss 26 by using a second screw (F).

As shown in FIG. 9, the printed circuit 181 and the module cover 20 are not facing to each other such that the heat generated in the printed circuit board 181 may not be transmitted to the display panel 10 directly. According to at least one of the embodiments described above, the overall weight and manufacture cost of the product may be reduced by fabricating the module cover 20 attached to the rear surface of the display panel 10 of the plastic injection mold.

In addition, heat may be effectively radiated even unless using the metal module cover 20 and the temperature of a specific area may be prevented from rising in the display device 100.

Figure 10:
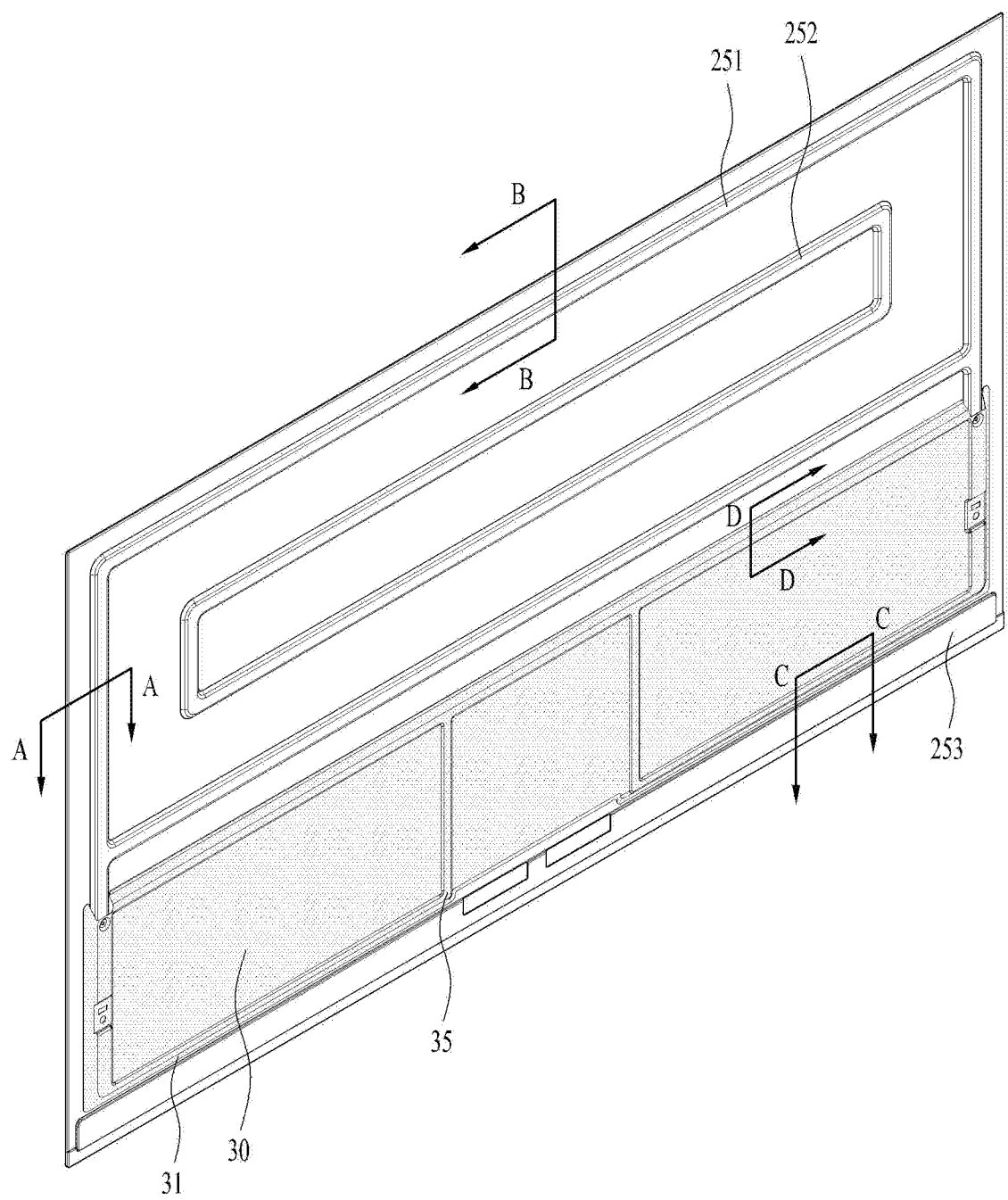
FIG. 10 is a perspective diagram illustrating a rear surface of the display device in a state where a rear cover in accordance with one embodiment is removed from the rear surface.
Figure 11:
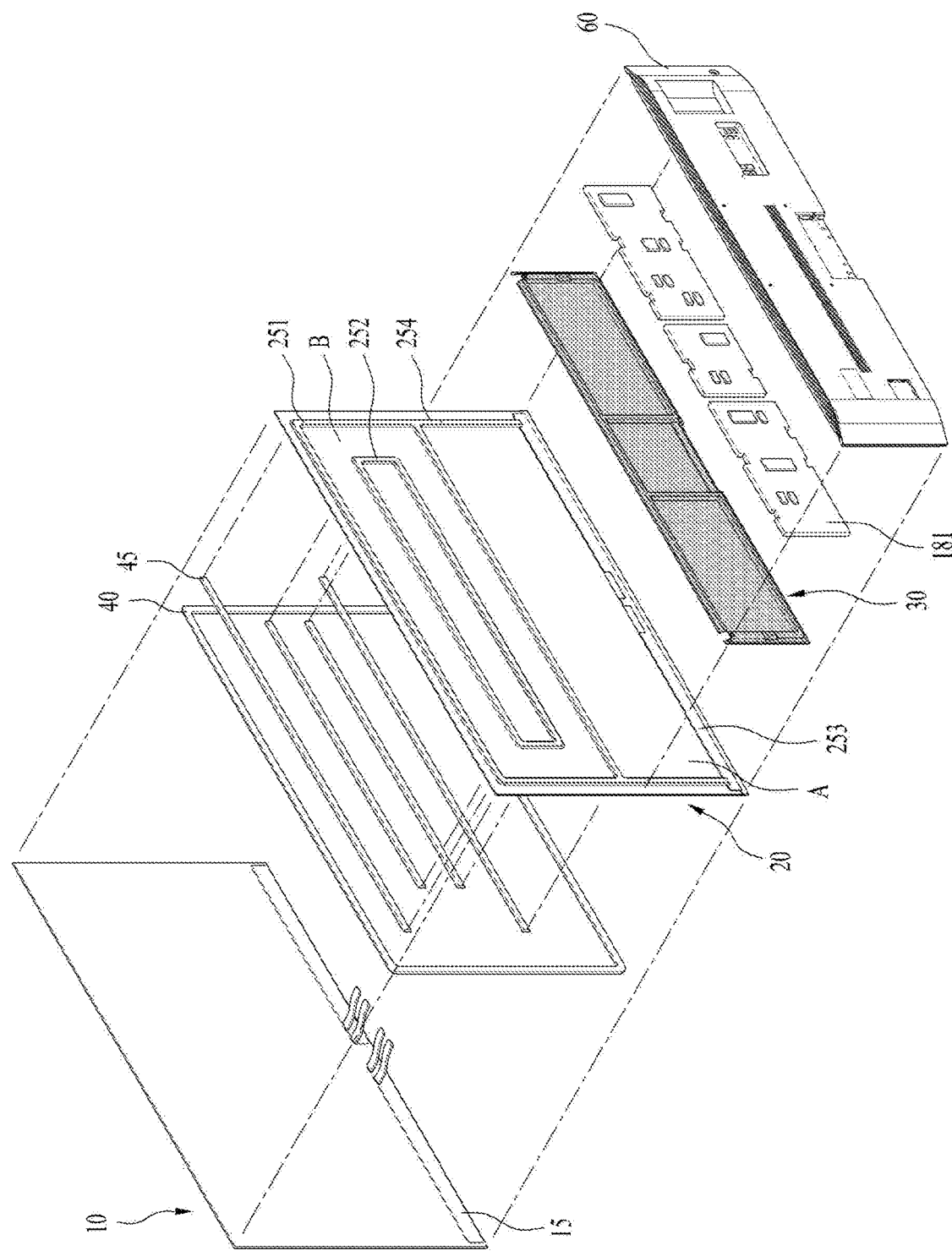
FIG. 11 is an exploded perspective diagram illustrating one embodiment of the display device.

FIG. 10 is a perspective diagram illustrating a rear surface of the display device 100 in a state where a rear cover is removed from the rear surface in accordance with another embodiment. FIG. 11 is an exploded perspective diagram illustrating another embodiment of the display device 100. The display device 100 includes a display panel 10; a module cover 20 disposed on a rear surface of the display panel 10; a substrate plate 30 configured to cover a first area (A) of a rear surface of the module cover 20; and a controller 180 coupled to a rear surface of the substrate plate 30 and implemented to control the display panel 10. The controller 180 includes a printed circuit board 181 and a drive chip loaded on the printed circuit board 181.

The module cover 20 may be coupled to the rear surface of the display panel 10 by using an adhesive material 40. The adhesive material 40 may use a double-sided tape. In the drawing, the adhesive material provided in only an edge area is shown and additional adhesive material may be provided for the stable coupling.

The inner plate and the hard bar are provided in the module cover 20 of the conventional display device to reinforce the stiffness of the display device 100. However, the display device in accordance with the present disclosure may use only the module cover 20 to support the stiffness of the display device 100, without the inner plate and the hard bar. Accordingly, the number of the components may be reduced and the thickness of the display device 100 may be also reduced by omitting the inner plate and the hard bar.

Unless the inner plate and the hard bar are provided, the stiffness is likely to become weak and the weakened stiffness needs to be compensated. As shown in FIG. 11, a bead 25 may be formed in a second area (B) of the module cover 20, except the first area (A). The bead 25 means the projection partially projected from one surface toward the other surface of the metal plate by using the stamp having the uneven area.

When the uneven area of the stamp presses one surface of a metal plate and the corresponding area of the metal plate to the uneven area is stretched to be projected to the other opposite surface such that the projected area may be the bead 25. Such the forming method may be called 'the beading'. The bead 25 extended in one direction may reinforce the stiffness of the display device 100 against the force bending along the extended direction of the bead.

The display device shown in FIG. 10 is longer in a horizontal direction and deformation is likely to occur in the horizontal direction. The horizontally extended length of the bead is longer than the vertically extended length of the bead 25. Considering the design exposed outside, the bead may be formed in a rectangular shape rather than a lattice shape. The wide and high bead 25 could be helpful in reinforcing the stiffness but make the display device 100 thick. As the module cover 20 becomes thicker, the beading becomes more difficult to form a large bead 25. Accordingly, it is important to determine the minimum size of the bead 25 which is proper to the stiffness standard.

Figure 12:
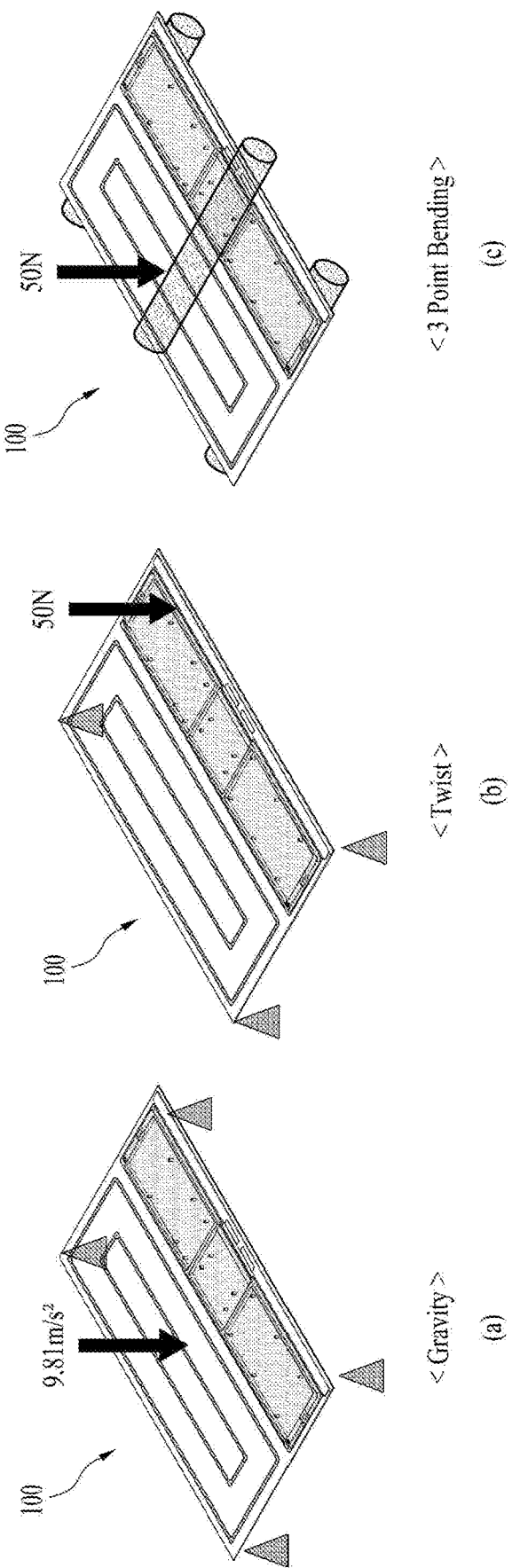
FIG. 12 is a diagram to describe a method of testing the stiffness of the display device.

FIG. 12 is a diagram to describe a method of testing the stiffness of the display device 100. FIG. 12 (a) shows a method of measuring a degree of the deflection generated by the gravity. When four corners of the display device are supported, the deflection generated when the display device droops to be deformed. A difference of height between a central area having the largest deflection degree and the supported corners may be measured to determine the deflection degree based on the measured difference.

FIG. 12 (b) shows a method of measuring the deflection degree when one of the corners is pressed while the other corners are fixed. A difference of height between the pressed corner and the supported corner is measured and the deflection degree is calculated based on the measured difference. FIG. 12 (b) shows that a 3-point bending method. According to the 3-point bending, both horizontal ends are supported and a central area is pressured only to measure a deflection degree.

Referring to FIG. 3, the substrate plate 30 is arranged in the lower portion and a first bead 251 formed along an outer area of the second area (B) arranged in the upper portion may further provided. To secure the additional stiffness, a second bead formed in a rectangular shape may be formed in the first bead 221.

Figure 13:
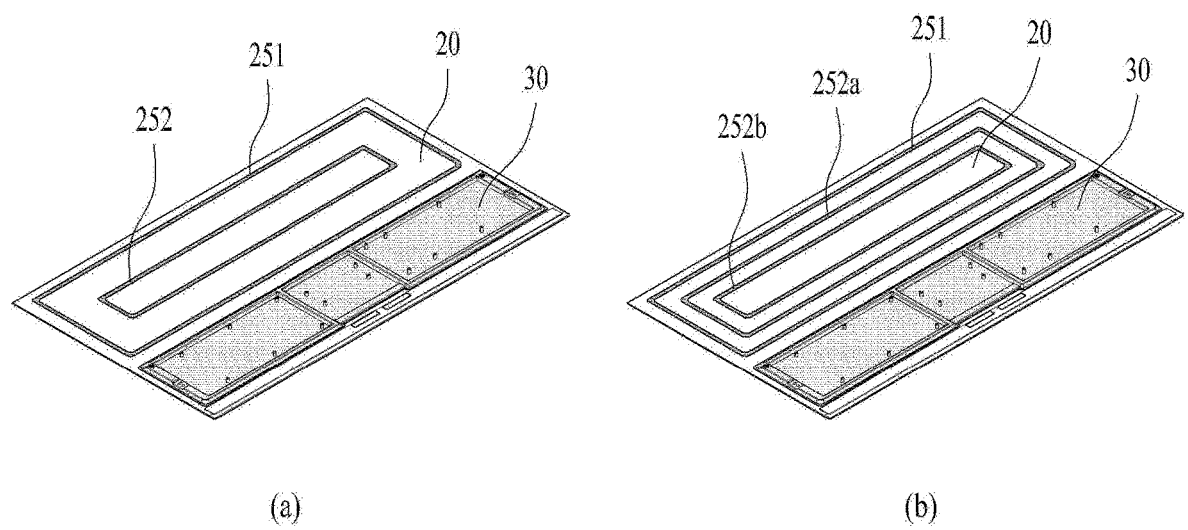
FIGS. 13 and 14 are diagrams to describe a function in accordance with a bead provided in the display device.

FIG. 13 is a diagram to describe the stiffness according to the shape of the bead 25 provided in the display device 100. FIG. 13 (a) illustrates that one second bead 252 is provided and FIG. 12 (b) illustrates that two second beads 252 are provided. FIG. 13 (c) illustrates the deflection degrees measured according to three methods shown in FIG. 12 in case of one second bead 252 and in case of two second beads 252.

Referring to FIG. 13 (c), 'Reference' refers to a deflection degree of the display device 100 further including the conventional inner plate and hard bar. 1 mm-3 mm means the height of the bead 25. When the two second beads 252 are provided, the beads 252 become higher and the deflection degrees become smaller to improve the stiffness.

The bead 25 having the thickness of 2 mm, which includes the two second beads 252, improves the stiffness more than the bead 25 having the height of 2 mm, which includes the single first bead 252, while it has a larger deflection degree than the bead 25 having the height of 3 mm.

Accordingly, it is more advantageous in terms of performance to increase the height from 2 mm to 3 mm than to increase the number of the second beads 252. As shown in FIG. 6 (c), it is confirmed that Type A of the display device 100 using the bead 25 having the height of 3 mm, without the conventional inner plate and the hard bar, has the improved stiffness than the conventional display device 100.

Figure 14:
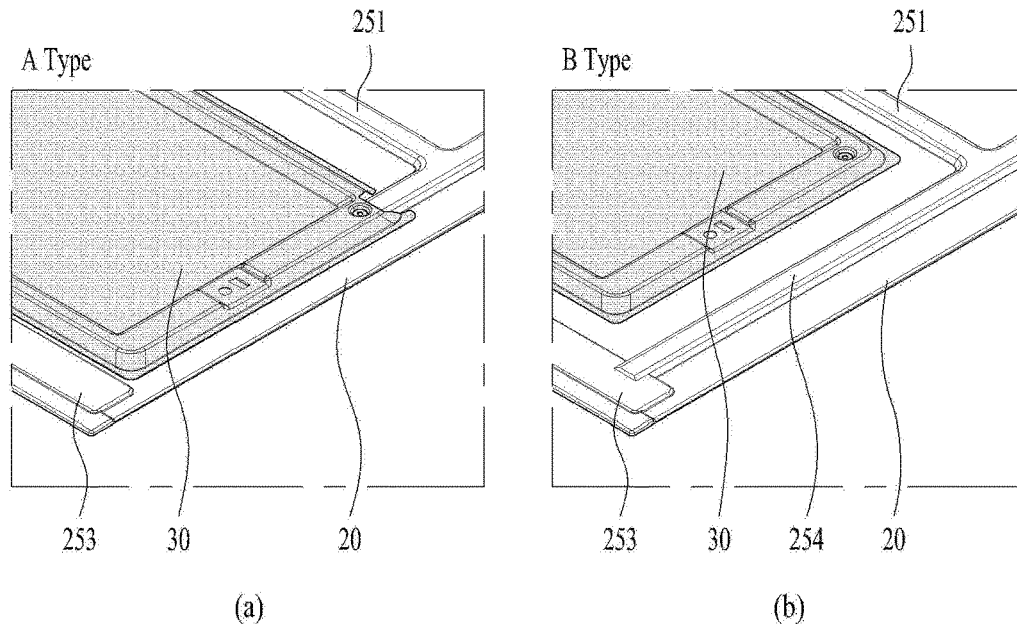

FIG. 14 is a diagram to describe a third bead 253 and a fourth bead 254 which are provided in the display device 100 in accordance with the present disclosure. When the bead 25 is formed only in the upper area, the stiffness of the lower area becomes weak and a horizontally extended third bead 253 may be formed even in the lower area of the substrate plate 30. The third bead 253 may be formed, corresponding to the panel drive unit 15 disposed in the lower area of the display panel 10.

The panel drive unit 15 may be connected with the lower area of the display panel 10 as a flexible substrate. The flexible substrate is bent to be attached to a rear surface of the display panel 10. Diverse ICs are attached to the panel drive unit 15 and heat is generated when the display panel 10 is driven. The panel drive unit 15 may be arranged in close contact with the module cover to transmit the heat generated in the panel drive unit 15 to the module cover 20 and disperse the heat.

As shown in FIGS. 14 (a) and 14 (b), the third bead 253 may be formed lower than the other beads 25. When the bead 25 is formed high, the stiffness may be improved but the bead 25 is likely to be spaced apart from the panel drive unit 15 disadvantageously. The width and height of the third bead 253 may be determined, corresponding to the width and thickness of the panel drive unit 15.

FIG. 14 (b) illustrates that a fourth bead 254 is further provided in each of the right and left areas of the substrate plate 30 shown in FIG. 7. As shown in FIG. 7 (c), the deflection degree of the display device 100 (Reference) including the conventional inner plate and the hard bar and the deflection of the display device; the deflection of the embodiment of the display device including the module cover having the thickness of 1.2 T (1.2 mm) and the bead 25 having the height of 3 mm in the structure shown in FIG. 7 (a) (Type A); the deflection of the display device including the module cover 20 having the thickness of 1 T (1 mm) and the bead 25 having the thickness of 5 mm; and the deflection of the display device 100 (Type B) further including the fourth bead 25 when including the bead having the thickness of 1 T (5 mm).

Even then the thickness of the module cover 20 is reduced in Type A, it is preferred to enlarge the height of the bead 25 in case of the deflection caused by the gravity and the 3-point bending so as to improve the performance more. In this instance, there is no bead 25 in the lower area of the module cover 20 such that the deflection degree generated by the twisting might become enhanced more to deteriorate the performance than in the conventional display. To improve the twisted deflection even when using the module cover having 1.0 T, the fourth beads 254 may be further extended from the left and right areas of the substrate plate 30 in a vertical direction so as to improve the overall stiffness.

Figure 15:
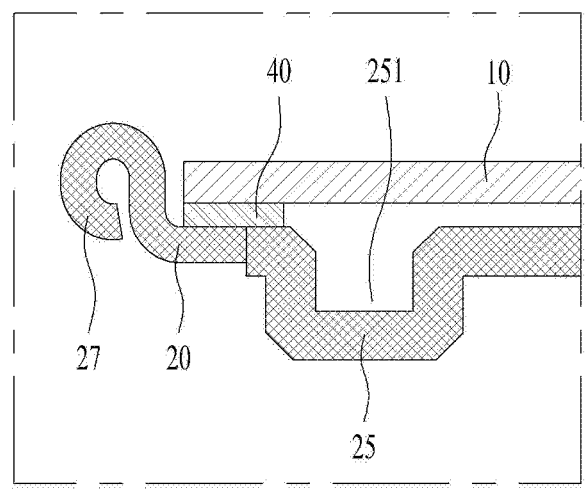
FIG. 15 is a sectional diagram along A-A and B-B of FIG. 10.
Figure 15:
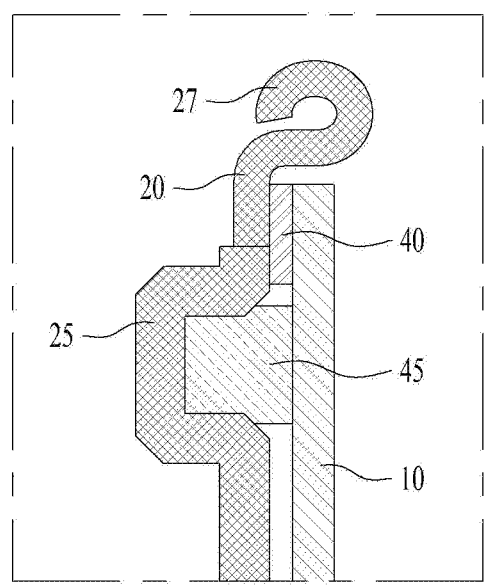

FIG. 15 is a sectional diagram along A-A and B-B of FIG. 10. An end of the metal plate provided as the raw material of the module cover 20 is sharp. To prevent the user's injury, the sharp end of the metal plate is rolled not to be exposed outside.

When the bead 25 is formed in the module cover 20 as mentioned above, the bead 25 projected toward the rear surface may have a bead groove 25' formed relatively toward the front surface. An air pocket occurs in the bead groove 25' and the air pocket stays air in the display panel 10 and the bead groove 25'. When the display panel 10 is driven, hot air might stay in the bead groove 25' only to interfere with the circulation of the heat generated in the display panel 10 and deteriorate the heat radiation performance.

Figure 16:
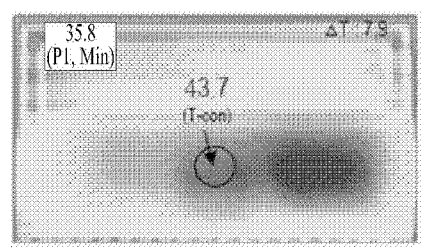
FIG. 16 is a diagram to describe the heat generation of the display device in accordance with presence of a filler.
Figure 16:
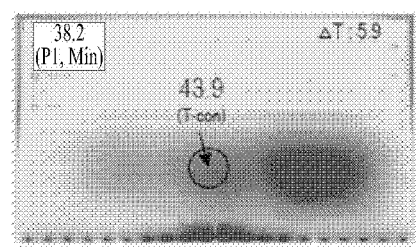
Figure 16:
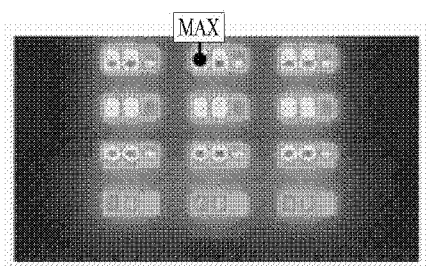
Figure 16:
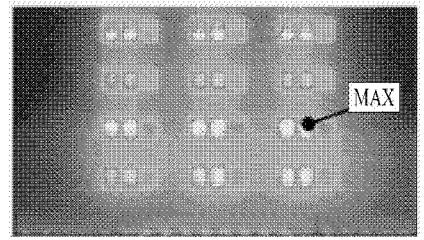

FIGS. 16 (a) and 16 (b) shows the data of the detected heat on a screen when the air pocket configured to stay hot air occurs in the bead 25. FIG. 16 (a) shows the temperature is measured once the temperature is saturated at a preset value after the entire screen is turned on to be white (a white screen) for a long time period. The temperature of the lower area having the controller 180 is relatively high and the upper area is relatively low. In this instance, the heat generated in the lower area is dispersed to the upper area uniformly as hot air stays in the air pocket formed by the bead 25 such that the heat radiation cannot be performed disadvantageously.

FIG. 16 (b) shows the temperature measured in a state where the temperature is saturated while squares having different brightness are output on some area of the screen. The maximum temperature is 82.9. The heat radiation has to disperse heat to lower the maximum temperature area such that the uniform heat distribution in which the temperature of the maximum temperature area has to be lower and a difference between the maximum temperature and the minimum temperature has to be shown. As the heat circulation is interfered with by the air pocket, a filler 45 may be filled in the bead groove 25' as shown in FIG. 15 (b). The filter 45 is configured to remove the air pocket and formed of a material with good heat transmission or an adhesive tape so as to replace the adhesive tape 40 provided to attach the module cover 20 to the display panel 10.

FIGS. 16 (c) and 16 (d) shows that the temperature is measured in case the filler 45 is filled in the bead groove 25'. Referring to FIG. 16 (c) illustrating the temperature of the white screen, the temperature difference is lowered from 7.9 to 5.9. As a square of which only some area is bright is output as shown in FIG. 16 (d), both the maximum temperature and the average temperature are lowered.

When the entire area of the bead groove 25' formed by the bead 25 is filled with the filler 45, a closed space is generated and air is not circulated disadvantageously. Accordingly, only in the bead groove 25' of the horizontal bead 25 may be filled with the filter 45 as shown in FIG. 15 (b), not in some other bead groove 25' as shown in FIG. 15 (a).

Figure 17:
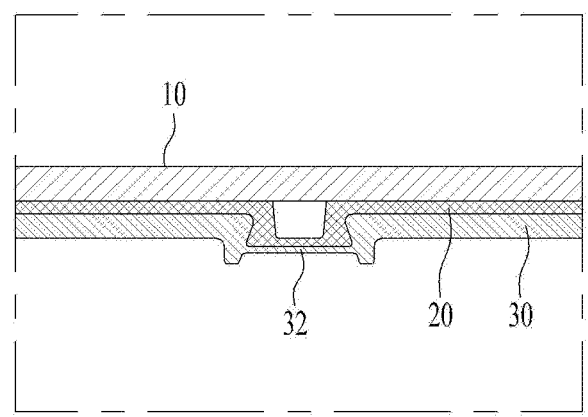
FIG. 17 is a sectional diagram along C-C and D-D of FIG. 10.
Figure 17:
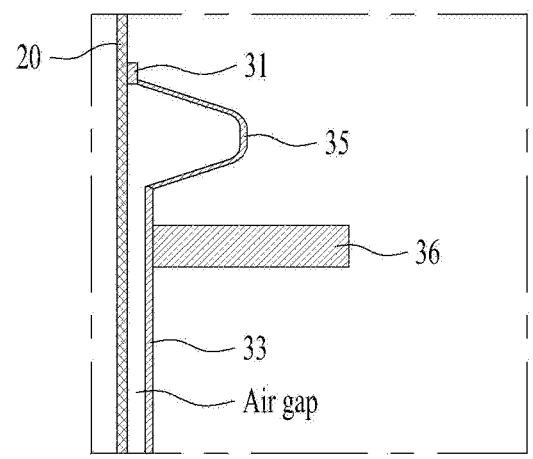
Figure 18:
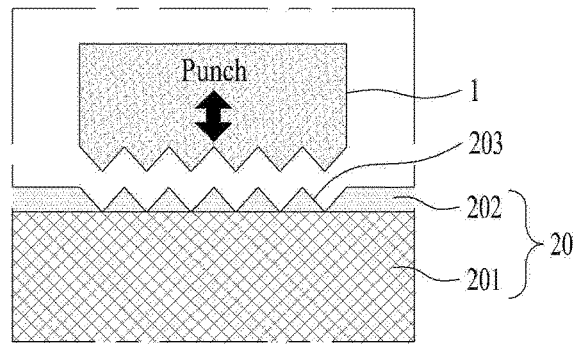
FIG. 18 is a diagram to describe a coupling unit.
Figure 18:
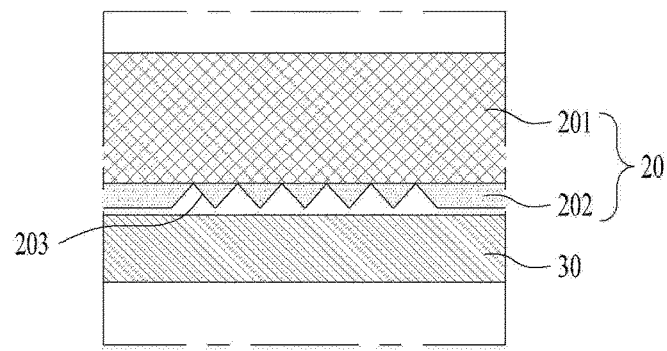
Figure 18:
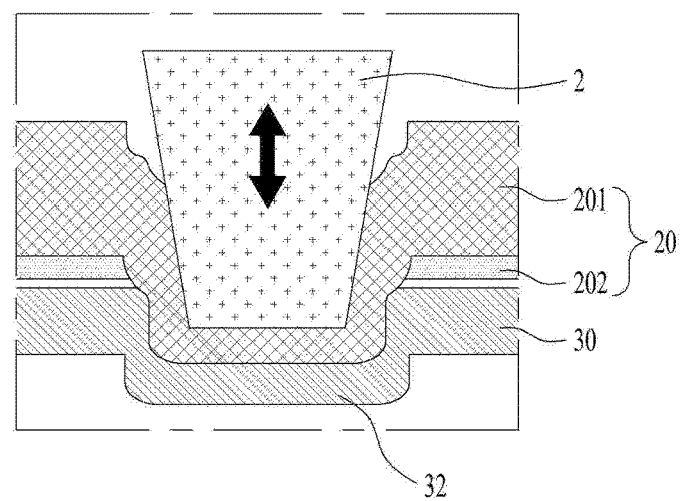

FIG. 17 is a sectional diagram along C-C and D-D of FIG. 10 and illustrates a coupling state of the module cover 20 and the substrate late 30. The module cover 20 and the substrate plate 30 are partially coupled to each other and spaced a preset distance apart from each other, to form an air gap. The air gap may be configured to prevent the heat generated in the controller loaded in the substrate plate 30 from being directly transmitted to the display panel 10 via the module cover 20.

More specifically, the substrate plate 30 includes a contact portion 31 configured to directly contact with the module cover 20; and a distant portion 33 distant from the contact portion 31. The contact portion 31 may be provided in a circumferential area of the substrate plate 30. The module cover 20 is partially coupled to the contact portion 31 by using a screw or rivet or the module cover 20 and the substrate plate 30 are compressed to couple them to each other. the area in which the module cover 20 and the substrate plate 30 are coupled to each other may be a coupling area 32 and the coupling area 32 may be formed in some area of the contact portion The compressing method is convenient, because it requires no additional member such as a screw or rivet. However, the compressing method may require a current carrying structure such as a wide metal body so as to prevent the damage to the controller 180 caused by the static electricity. In other words, the module cover 20 and the substrate plate 30 are electrically connected with each other to take out the static electricity applied to the controller 180 from the module cover 20 so as to protect the controller 180.

The module cover is an external member and a metal plate 201 having a coated layer 202 formed on one surface. As the metal plate 201 are not exposed outside by the coated layer 202, the coating is removed from the corresponding area to the coupling area 32 and then the metal plate of the module cover 20 may be compressed and coupled to the substrate plate 30. Referring to FIG. 11, a stamp having an uneven area is stamped on the rear surface of the module cover 20 (e.g., a punch), only to partially remove the coated layer 202.

After that, the compressing process is performed and the substrate plate 30 and the module cover 20 are electrically connected with each other to prevent the static electricity.

Referring to FIG. 10, the back cover 60 coupled to the rear surface of the substrate plate 30 may be formed of the same material with the module cover 20 or an injection mold. As shown in FIG. 3, the back cover 60 has ventilation holes which are formed in upper and lower areas to discharge the heat generated in the controller 180. To be coupled to the back cover 60, the substrate plate 30 may include a boss (36, see FIG. 17 (b)) projected toward the rear surface.

According to at least one of the embodiments, the thickness of the module cover and the number of the components may be reduced. Accordingly, the manufacture cost and weight of the display device 100 may be also reduced.

Furthermore, even when the module cover is simplified, the stiffness of the display device 100 may be maintained. Also, the heat generated in the display device 100 may be effectively radiated.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A display device comprising:
a display panel;
an inner plate disposed on a rear surface of the display panel;
a module cover disposed on a rear surface of the inner plate and having a first area at a rear surface;
an inner space formed between the inner plate and the module cover;
a back cover configured to form a loading portion by covering the first area; and
an electric control unit placed at the loading portion,
wherein the module cover comprises:
a lateral wall portion surrounding a circumference of the first area and configured to define a lateral surface of the loading portion;
an inclined portion inclined from the lateral wall portion and extended toward a front side of the display device;
a first vent hole formed in a first lateral wall portion provided in an upper area of the lateral wall portion and configured to communicate the loading portion and the inner space;
a second vent hole formed in a first inclined portion provided in an upper area of the first area and configured to communicate the inner space with the outside;
a third vent hole formed in an upper area of the module cover outside the first area and configured to communicate the inner space with the outside; and
a fourth vent hole formed in the back cover configured to communicate the outside with the loading portion.

2. The display device of claim 1, further comprising:
a reinforcing rib projected from a front surface of the module cover.

3. The display device of claim 2, wherein the reinforcing rib comprises:
a support area configured to contact with the inner plate; and
a communication area spaced apart from the inner plate, and
wherein air drawn into the inner space from the loading portion via the first vent hole passes the communication area and is exhausted via the third vent hole.

4. The display device of claim 3, wherein the reinforcing rib comprises:
a first rib extended horizontally; and
a second rib extended vertically, and
wherein the communication area is formed in the first rib.

5. The display device of claim 4, wherein the first rib and the second rib are arranged in a lattice shape, and
wherein the communication area is located at an intersection of the first rib and the second rib.

6. The display device of claim 1, further comprising:
a plurality of coupling holes formed in the inner plate; and
a coupling projection projected from a front surface of the module cover toward the inner plate and exposed via the coupling holes,
wherein the coupling projection is formed in the coupling hole by thermosetting.

7. The display device of claim 6, further comprising:
a thermosetting groove recessed from an outer edge area of the coupling hole toward the rear surface,
wherein an end of the thermoset coupling projection is larger than a diameter of the coupling hole and smaller than a diameter of the thermosetting groove.

8. The display device of claim 7, further comprising:
a reinforcing rib projected from a front surface of the module cover,
wherein the coupling projection is formed on the reinforcing rib, and
wherein the reinforcing rib comprises a groove formed around the coupling projection, corresponding to the thermosetting groove.

9. The display device of claim 1, further comprising:
a boss projected from a front surface of the module cover;
a boss hole formed in the inner plate, corresponding to the boss; and
a screw configured to be fastened to the boss hole.

10. The display device of claim 1, further comprising:
a first boss projected from the first area of the module cover toward the rear surface;
a second boss projected from the inner plate toward the rear surface;
a first boss hole formed in the module cover and configured to pass the second boss therethrough;
a printed circuit board comprising a second boss hole corresponding to the first boss and the second boss; and
a screw configured to penetrate the second boss hole of the printed circuit board and be fastened to the first boss and the second boss.

* * * * *